(12) United States Patent
Strang

(10) Patent No.: US 11,988,878 B2
(45) Date of Patent: May 21, 2024

(54) TRANSITION FOR AN OPTICAL FIBRE CABLE

(71) Applicant: ROXTEC AB, Karlskrona (SE)

(72) Inventor: Daniel Strang, Karlskrona (SE)

(73) Assignee: ROXTEC AB, Karlskrona (SE)

( * ) Notice: Subject to any disclaimer, the term of this patent is extended or adjusted under 35 U.S.C. 154(b) by 327 days.

(21) Appl. No.: 17/428,377

(22) PCT Filed: Feb. 5, 2020

(86) PCT No.: PCT/SE2020/050104
§ 371 (c)(1),
(2) Date: Aug. 4, 2021

(87) PCT Pub. No.: WO2020/162819
PCT Pub. Date: Aug. 13, 2020

(65) Prior Publication Data
US 2022/0120977 A1   Apr. 21, 2022

(30) Foreign Application Priority Data

Feb. 6, 2019 (SE) .................................. 1950138-6

(51) Int. Cl.
| | | |
|---|---|---|
| G02B 6/38 | (2006.01) |
| G02B 6/42 | (2006.01) |
| G02B 6/46 | (2006.01) |
| H02G 1/14 | (2006.01) |
| H02G 3/22 | (2006.01) |

(Continued)

(52) U.S. Cl.
CPC ............ *G02B 6/3835* (2013.01); *G02B 6/475* (2023.05); *H02G 1/14* (2013.01); *H02G 3/22* (2013.01); *H02G 15/08* (2013.01); *H05K 9/0009* (2013.01); *H05K 9/0018* (2013.01);
(Continued)

(58) Field of Classification Search
CPC ...... G02B 6/38; G02B 6/3835; G02B 6/4236; G02B 6/4248; G02B 6/4277; G02B 6/475; H02B 3/22; H02B 15/08; H02G 1/14; H05K 9/0009; H05K 9/0018
See application file for complete search history.

(56) References Cited

U.S. PATENT DOCUMENTS 4,822,130 A   4/1989   Maranto et al.
4,896,939 A   1/1990   O'Brien
(Continued)

FOREIGN PATENT DOCUMENTS

| CN | 101185219 A | * 5/2008 | ............... H02G 3/22 |
| CN | 107994359 | 5/2018 | |

(Continued)

OTHER PUBLICATIONS

Office Action dated Oct. 4, 2022 in the corresponding JP-application No. 2021-542306 (7 pages).
(Continued)

*Primary Examiner* — Daniel Petkovsek
(74) *Attorney, Agent, or Firm* — Merchant & Gould P.C.

(57) ABSTRACT

A transition for an optical fibre cable through a partition. The optical fibre cable is received inside a shield pipe, which shield pipe is of an electrically conductive material. The shield pipe is received in an axial through opening of the holding means. One end of the shield pipe is received inside a holding means having a sealing function.

17 Claims, 3 Drawing Sheets

(51) Int. Cl.
  *H02G 15/08*  (2006.01)
  *H05K 9/00*  (2006.01)
  *G02B 6/44*  (2006.01)

(52) U.S. Cl.
  CPC .............. *G02B 6/38* (2013.01); *G02B 6/4248* (2013.01); *G02B 6/4277* (2013.01); *G02B 6/4436* (2013.01)

(56) References Cited

U.S. PATENT DOCUMENTS

| | | | |
|---|---|---|---|
| 6,198,871 | B1 | 3/2001 | Gregor et al. |
| 9,618,718 | B2 * | 4/2017 | Islam .................. G02B 6/4416 |
| 11,042,003 | B2 * | 6/2021 | Coenegracht ........ G02B 6/3825 |
| 2012/0015555 | A1 * | 1/2012 | Deimel .................... H02G 3/22 |
| | | | 439/607.41 |
| 2012/0073872 | A1 * | 3/2012 | Hildingsson ............. H02G 3/22 |
| | | | 174/362 |

FOREIGN PATENT DOCUMENTS

| | | |
|---|---|---|
| DE | 19932581 A1 | 1/2001 |
| EP | 3346563 A1 | 7/2018 |
| EP | 3392988 | 10/2018 |
| JP | S6036602 U | 3/1985 |
| JP | 2013542702 A | 11/2013 |
| JP | 2016172997 A | 9/2016 |
| WO | 2009139713 A1 | 11/2009 |
| WO | 201014753 A1 | 12/2010 |

OTHER PUBLICATIONS

MCT Brattberg, "EMC—Electromagnetic Compatibility," [Archived 2017 at https://web.archive.org/web/20170403040742/http://www.mctbrattberg.se/media/c395e576-c941-47d9-9c7d-2977c8fb9740/GRmYFA/Gallery/Download/EMC-UK.pdf); pp. 4-5.
Supplementary European Search Report dated Sep. 28, 2022 in the corresponding EP Applilcation No. 20 75 2226 (2 pages).
International Search Report for International Application No. PCT/SE2020/050104 dated Mar. 31, 2020 (4 pages).

* cited by examiner

TRANSITION FOR AN OPTICAL FIBRE CABLE

This application is a National Stage Application of PCT/SE2020/050104, filed 5 Feb. 2020, which claims benefit of Serial No. 1950138-6, filed 6 Feb. 2019 in Sweden, and which applications are incorporated herein by reference. To the extent appropriate, a claim of priority is made to each of the above disclosed applications.

TECHNICAL FIELD

The present invention concerns a transition for an optical fibre cable. It more specifically concerns electromagnetic shielding of an optical fibre cable going through a partition of some kind.

PRIOR ART

The use of optical fibre cables has increased over time. In some installations where an optical fibre is to pass a partition it is vital to attenuate electromagnetic disturbances to protect different electrical or electronic equipment on the inside or outside of the partition.

Electrical and electronic devices are more or less sensitive to electromagnetic disturbance. Electromagnetic disturbance is electromagnetic radiation which often is emitted by electrical circuits carrying rapidly changing signals, as a by-product of their normal operation, and which causes unwanted signals (interference or noise) to be induced in other electrical circuits. This interrupts, obstructs or otherwise degrades or limits the effective performance of those other circuits. Electromagnetic disturbances can be induced intentionally, as in some forms of electronic warfare, or unintentionally, as a result of spurious emissions, intermodulation products and the like.

Most optical fibre cable do not have any electrically conductive parts that can be used to shield of any disturbances. A common method to shield an optical fibre cable is to use waveguides. A waveguide is basically a pipe of an electrical conductive material. It is known that the shielding result depends on the length and inner diameter of the pipe. The length of the pipe should be at least 4 to 5 times the inner diameter of the pipe. Depending on the demands, the inner diameter of the pipe is often chosen to be close to the outer diameter of the optical fibre cable.

In addition to shield of electromagnetic disturbances there is often a need to seal the opening of the partition receiving the optical fibre cable and also to give a fire protection. The demands on sealing and possible fire protection depends on circumstances for each installation.

SUMMARY

In view of the above there is a need to shield transits for optical fibre cables against electromagnetic disturbances in connection with passage of partitions.

The above object is achieved with a transition according to claim 1. The dependent claims specify further features.

In one embodiment, there will be up to three different types of protection, namely shielding, sealing, and optionally fire protection.

Further objects and advantages of the present invention will be obvious to a person skilled in the art when reading the detailed description of different embodiments.

BRIEF DESCRIPTION OF THE DRAWINGS

The present invention will be described below by way of example and with reference to the enclosed drawings. In the drawings.

DETAILED DESCRIPTION OF EMBODIMENTS

Figure 1:
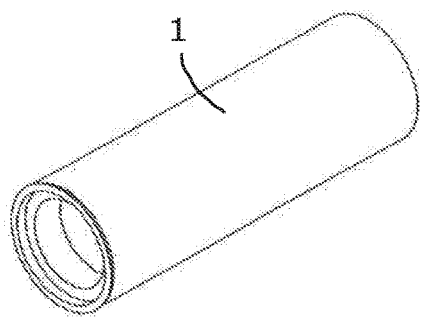
FIG. 1 is a perspective view of a shield pipe.
Figure 2:
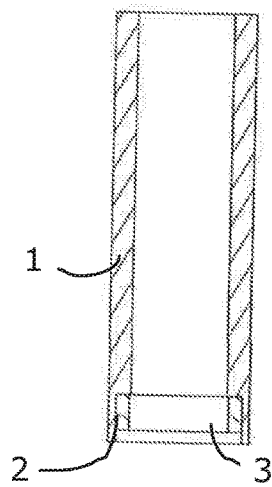
FIG. 2 is a cross section view of the shield pipe of FIG. 1.
Figure 3:
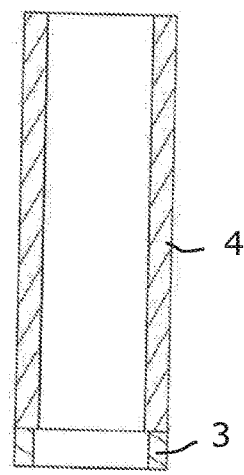
FIG. 3 is a cross section view of a shield pipe according to a second embodiment.
Figure 4:
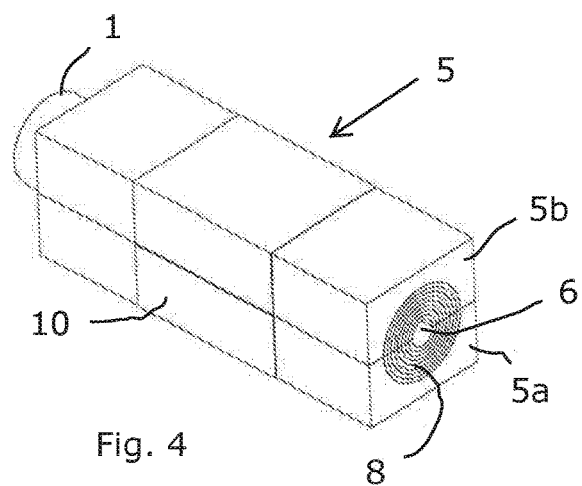
FIG. 4 is a perspective view of a module enclosing a shield pipe.
Figure 5:
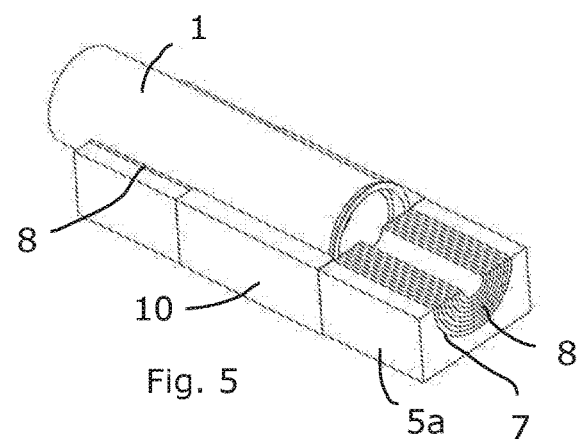
FIG. 5 is a cut open perspective view of the module of FIG. 4.
Figure 6:
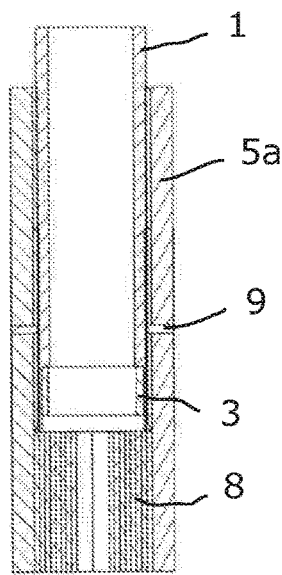
FIG. 6 is a cross section view of the module of FIGS. 4 and 5.
Figure 7:
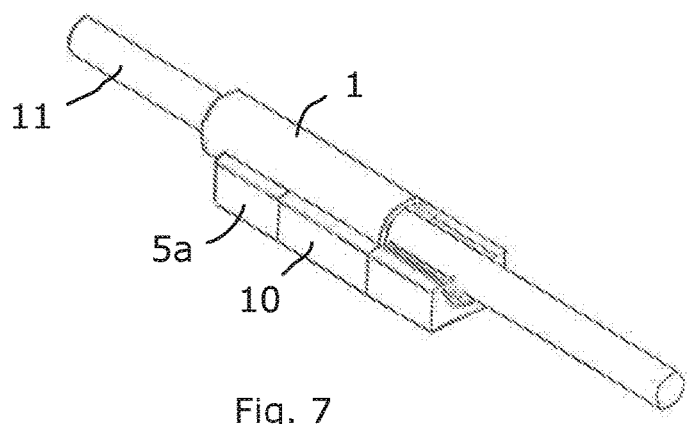
FIG. 7 is a view corresponding to FIG. 5, but with an optical fibre cable received.

According to the present invention a shield pipe 1, 4 is used as a waveguide for an optical fibre cable 11. The shield pipe 1, 4 is intended for use when the optical fibre cable 11 is to go through an opening of a wall, a roof or a top, a floor or a bottom of a house, a ship, an electrical cabinet, a container etc. The wall, roof or top, and floor or bottom could be expressed as any dividing structure or partition. To simplify, the term "partition" will mainly be used in this description as a general term for the different parts through which the optical fibre cable should go.

As used in this description the terms "axial", "radial" and corresponding terms are in view of a cable going through the transition.

In one embodiment the shield pipe 1 has an inner recess 2 at one end. Said recess 2 is intended for receiving a ring of intumescent material 3. The ring of intumescent material 3 is a separate part in one embodiment. In another embodiment the ring of intumescent material 3 is given as a coating on the inside of the shield pipe 1.

In a further embodiment the shield pipe 4 has no inner recess. If a ring of intumescent material 3 is to be used, said ring of intumescent material 3 is placed at one end of the shield pipe 4. The ring of intumescent material 3 is attached to the end of the shield pipe 4 by means of an adhesive.

In a further embodiment the ring of intumescent material 3 is placed inside an extended part of the shield pipe at one end of the shield pipe.

The ring of intumescent material 3 is used as a fire protection. As is well known to a person skilled in the art, the intumescent material 3 will swell when exposed to excessive heat, such as in case of a fire. In the shown embodiments, the intumescent material 3 has the form of a ring and is placed at one end of the shield pipe 1, 4. The ring of intumescent material 3 may only be used when required for fire safety.

Thus, if fire protection is not an issue, the intumescent material 3 is normally not included.

The shield pipe 1, 4 has an inner diameter that ideally is close to the outer diameter of an optical fibre cable 11 to be received inside the shield pipe 1, 4. The length of the shield pipe 1, 4 should be minimum four to five times the diameter of the shield pipe 1, 4. The shield pipe 1, 4 is made of an electrical conductive material in order to act as a waveguide. The shield pipe 1, 4, acting as a waveguide, acts as a filter against electromagnetic disturbances. As many optical fibre cables do not contain any metallic parts they do not have any shield against electromagnetic disturbances.

The shield pipe 1, 4 is placed in some kind of holding means placed in an opening of the partition, which holding means also has a sealing function in combination with a shielding function.

According to one embodiment, the holding means is a module 5, which is made of a compressible material. Said module 5 comprises a first module half 5a and a second module half 5b. An axial through opening 6 is formed in the centre of the module 5. Said axial through opening 6 is formed by means of a semi-cylindrical recess 7 in respective module half 5a, 5b. Thus, the axial through opening 6 is formed in that two module halves 5a, 5b are placed against each other with the semi-cylindrical recesses 7 facing each other.

A number of peelable layers 8 are placed on the inside of the axial through opening 6 of the module 5. The peelable layers 8 are placed in two or more sections in axial direction. Said layers 8 of the module 5 are peeled off to adapt the inner diameter of the through opening 6 of the module 5 to the outer diameter of the optical fibre cable 11 to be received inside the module 5 and to the outer diameter of the shield pipe 1, 4 to be received inside the module 5. Normally, different number of layers 8 are peeled off for adaption to an optical fibre cable 11 and a shield pipe 1, 4, respectively.

A barrier or shield 9 of electrically conductive rubber material is provided in the axial through opening 6 of the module 5. Said shield 9 is placed transversal to the axial through opening 6. The shield 9 goes to the outside on all sides of the module 5 and blocks the axial through opening 6. The purpose of the shield 9 is to block airborne disturbances from passing through the module 5. After possible removing of layers 8 to adapt the module 5 to the outer diameter of the shield pipe 1, 4 to be received, the shield 9 is cut to be flush with the inner diameter of the axial through opening 6 of the module 5.

A conductive tape 10 is provided going around each module half 5a, 5b in the area of the shield 9. In some embodiments there is no conductive tape 10, as the shield 9 normally will give enough shielding. The conductive tape 10 has an axial extension exceeding the axial extension of the shield 9 and the shield 9 is placed under the conductive tape 10. In the shown embodiment the shield 9 is placed in the middle of the conductive tape 10, as seen in axial direction. In other embodiments the shield 9 is placed in other positions as seen in axial direction. Before placing the shield pipe 1, 4 inside the module the optional conductive tape 10 is placed on the inner circumference of the axial through opening 6 of the module 5, covering the shield 9. With a shield pipe 1, 4 placed in the through opening 6 of the module 5, an outer surface of the shield pipe 1, 4 will be in contact with the conductive tape 10 or the shield 9.

Different sections of peelable layers 8 are placed on opposite sides of the shield 9, as seen in axial direction.

The shield pipe 1, 4 is placed inside the axial through opening 6 with one end of shield pipe 1, 4 placed adjacent one section of peelable layers 8. Said one end of the shield pipe 1, 4 is placed at a distance from an end of the module 5. The other end of the shield pipe 1, 4 is placed at or outside an end of the module 5. The shield pipe 1, 4 is normally placed in such a position inside the module 5, that the end of the shield pipe 1, 4 is about flash with an edge of the conductive tape 10, whereby the conductive tape 10 will cover an end area of the shield pipe 1,4.

Figure 8:
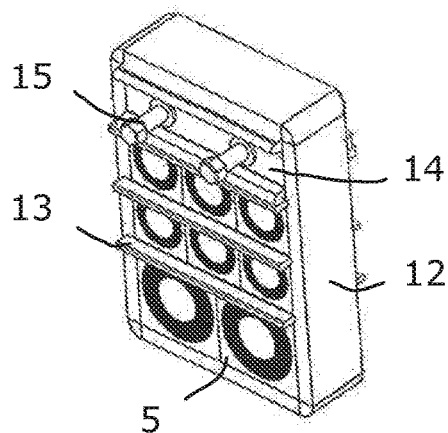
FIG. 8 is a perspective view of a transition, in which the modules of FIGS. 4-7 may be used.

The modules 5 are of use in a transition wherein a number of modules 5 are placed inside a frame 12, which frame is to be received in an opening of a partition. In the example of FIG. 8, a number of modules 5 are placed in rows inside the frame 12. Stay plates 13 are placed between the rows of modules 5 inside the frame 12. Furthermore, a compression unit 14, here in the form of a wedge, is placed inside the frame 12. The compression unit 14 comprises two screws 15 by means of which the compression 14 is moveable between a compressing state and a non-compressing state. In the compressing state of the compression unit 14, the modules 5 inside the frame 12 will be compressed, whereby each module 5 will pressed against an optical fibre cable 11 and shield pipe 1, 4 received inside said module 5.

When a shielding pipe 1, 4 is placed inside a module 5, it will be placed so that it is in contact with the conductive tape 10 or the shield 9, if no conductive tape 10 is used. The conductive tapes 10 or the shields 9 of the modules 5 placed inside the frame 12 will be in contact with each other and with the frame 12. Thus, each shield pipe 1, 4 placed in a module will be in electrical contact with the frame 12, which frame 12 should be of an electrically conductive material or have an electrically conductive surface.

Figure 9:
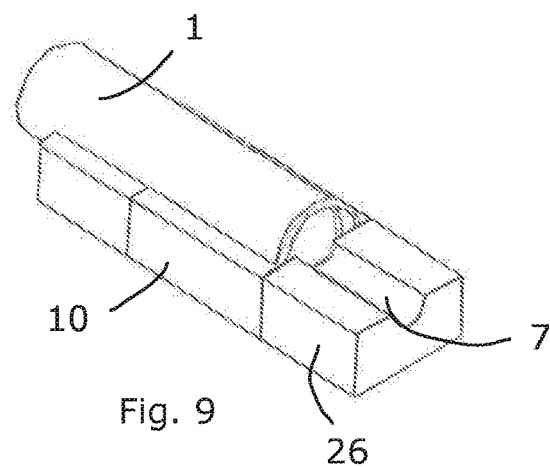
FIG. 9 is a perspective view of a module enclosing a shield pipe.
Figure 10:
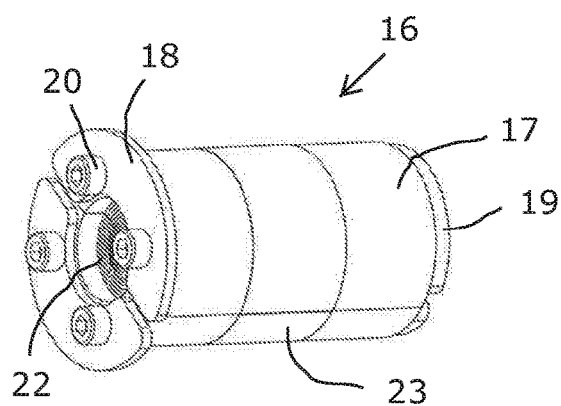
FIG. 10 is a perspective view of a cylindrical seal enclosing a shield pipe.
Figure 11:
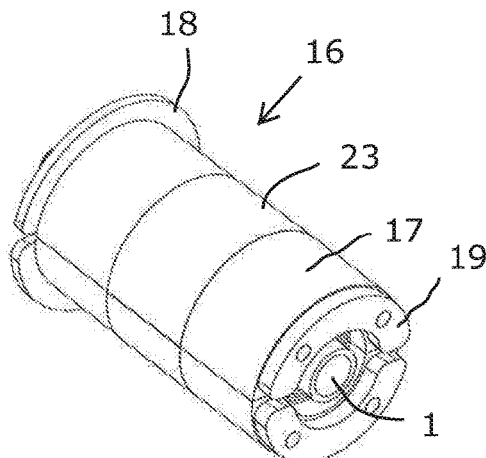
FIG. 11 is a perspective view of the cylindrical seal of FIG. 10 from another angle.
Figure 12:
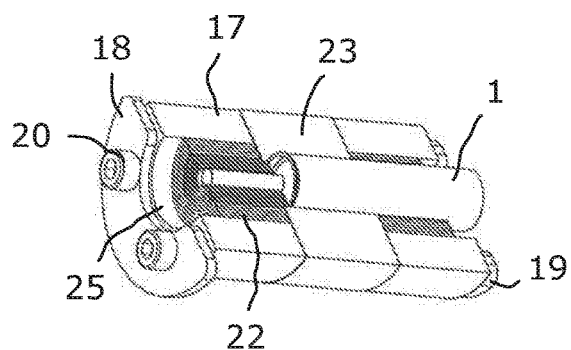
FIG. 12 is a cut open perspective view of the cylindrical seal of FIGS. 10 and 11.
Figure 13:
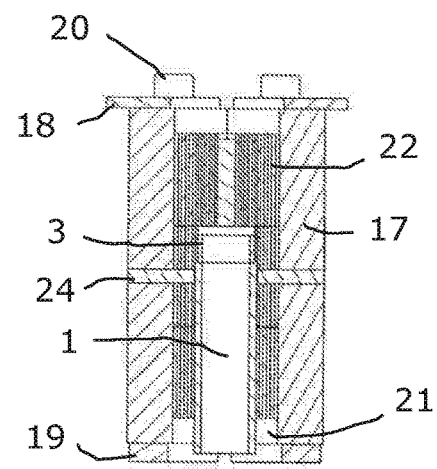
FIG. 13 is a cross section view of the cylindrical seal of FIGS. 10-12.

Instead of a module 5 having a number of peelable layers 8, a corresponding module having no layers may be used. In FIG. 9 one half of such a module 26 is shown. Except for the lack of layers, the module 26 correspond with the module 5 described above. For the corresponding parts, the same reference signs will be used. Each module half has a semi-cylindrical recess 7 whereby a an axial trough opening will be formed when two module halves are placed on top of each other with the semi-cylindrical recesses facing each other.

The module 26 has a shield 9, not visible in FIG. 9 and a conductive tape 10. The function and the object of said shield 9 and conductive tape 10, if present, is the same as for the module 5 described above and will not be repeated here. The shield pipe 1, 4 is placed in the module 26 with one end inside the module 26, at a distance from an end of the module 26. The other end of the shield pipe 1, 4 is placed at or outside an end of the module 26.

According to a further embodiment, the holding means for the shield pipe 1, 4 is a cylindrical seal 16. Said cylindrical seal 16 comprises a compressible body 17, a first fitting 18 and a second fitting 19, which first and second fittings 18, 19 are placed at opposite ends of the compressible body 17. Screws 20 are provided to move the fittings 18, 19 at opposite ends of the compressible body 17 towards each other in order to compress the compressible body 17. The cylindrical seal 16 is normally placed directly in an opening of a partition.

The compressible body 17 of the cylindrical seal 16 has an axial through opening 21. The compressible body 17 is formed of two halves, each half having a semi-cylindrical recess 25 and said axial through opening 21 is formed when the two halves are placed against each other with the semi-cylindrical recesses 25 facing each other. Peelable layers 22 are placed on the inside of the axial through opening 21, in two or more sections as seen in axial direction. Said layers 22 are peeled off in order to adapt to the outer diameter of an optical fibre cable 11 and to the outer diameter of the shield pipe 1, 4, respectively, to be received in the axial through opening 21. Normally, different number of layers 22 are peeled off for adaption to the optical fibre cable 11 and the shield pipe 1, 4, respectively.

A shield 24 of electrically conductive rubber material is provided in the axial through opening 21 of the cylindrical seal 16. Said shield 24 is placed transversally to the axial through opening 21. The shield 24 goes to the outside of the cylindrical seal 16 and blocks the axial through opening 21. In the shown embodiment the shield 24 is placed in the middle of the cylindrical seal 16, as seen in axial direction. In other embodiments the shield 24 is placed in other axial position between the ends of the cylindrical seal 16. The shield 24 is of an electrical conductive rubber material. The purpose of the screen 24 is to block airborne disturbances from passing through the cylindrical seal 16. After possible removing of layers 22 to adapt the cylindrical seal 16 to the outer diameter of the shield pipe 1, 4 to be received, the shield 24 is cut to be flush with the inner diameter of the axial through opening 21 of the cylindrical seal 16.

A conductive tape 23 is provided going around each half of the cylindrical seal 16 in the area of the shield 24. In some embodiments there is no conductive tape 23, as the shield 24 normally will give enough shielding. The conductive tape 23 has an axial extension exceeding the axial extension of the shield 24 and the shield 24 is placed under the conductive tape 23. Before placing the shield pipe 1, 4 inside the cylindrical seal 16 the optional conductive tape 23 is placed on the inner circumference of the axial through opening 21 of the cylindrical seal 16, covering the shield 24. Thus, in use the shield pipe 1, 4 is placed in the axial through opening 21 of the cylindrical seal 16 with an outer surface of the shield pipe 1, 4 in contact with the conductive tape 23 or in contact with the shield 24, if no conductive tape is used.

Different sections of peelable layers 22 are placed on opposite sides of the shield 24, as seen in axial direction.

The shield pipe 1, 4 is placed inside the axial through opening 21 with one end of shield pipe 1, 4 placed adjacent one section of peelable layers 22. Said one end of the shield pipe 1, 4 is placed at a distance from the end of the cylindrical seal 16. The other end of the shield pipe 1, 4 is placed at or outside an end of the cylindrical seal 16.

A person skilled in the art realizes that the holding means can have many different designs. It can have a rectangular or circular cross section, irrespectively if it is placed in some kind of frame or sleeve fastened in an opening of a partition or if it is placed directly in an opening of a partition.

The holding means, such as the module 5, 26 and the cylindrical seal 16, can be made of electrically conductive rubber material, in which case normally no shield 9, 24 is provided. In such cases the shielding function of the shield 9, 24 is replaced by a shielding effect of the electrically conductive rubber material of the holding means. A further possibility is to use an electrically conductive coating instead of the shield 9, 24 or the electrically conductive material, which electrically conductive coating is placed on the outer surfaces of the holding means.

The shield pipe 1, 4 is slightly flared outwards at the end to be received inside the holding means. The flared end will give an axial retention force. Such an axial retention force could be given in other ways, such as by increasing the friction of the outside of the shield pipe, at least at an end area. The increased friction could for instance be given by knurling or by means of a coating.

According to the present invention a combination of different types of protection are available for an optical fibre cable 11 in a transition at a partition. The shield pipe 1, 4 gives protection against electromagnetic disturbances. Further, the holding means have protective shields 9, 24. Thus, protection against electromagnetic disturbances is given irrespectively of if such electromagnetic disturbances goes along the optical fibre cable or are airborne. The modules 5, 26 and the cylindrical seal 16 give sealing. Optionally also a fire protection is provided in the form of an intumescent material 3.

The invention claimed is:

1. A transition for an optical fibre cable through a partition, wherein the transition comprises an electrically conductive frame, a shield pipe and a compressible holding module configured to have a sealing property, wherein the optical fibre cable is received inside the shield pipe, wherein the shield pipe comprises an electrically conductive material, wherein one end of the shield pipe is received inside the holding module and that the shield pipe is received in an axial through opening of the holding module, and wherein the shield pipe placed in the holding module is in electrical contact with the frame.

2. The transition of claim 1, wherein an intumescent material is received inside the shield pipe or at the end of the shield pipe received in the holding module.

3. The transition of claim 2, wherein the intumescent material is in the form of a ring.

4. The transition of claim 2, wherein the intumescent material is applied as a coating.

5. The transition of claim 1, wherein one end of the shield pipe is placed in the axial through opening of the holding module and wherein said one end of the shield pipe is placed at a distance from an end of the holding module.

6. The transition of claim 5, wherein the one end of the shield pipe received inside the holding module is flared to give an axial retention force.

7. The transition of claim 5, wherein the one end of the shield pipe received inside the holding module has knurls or a coating to give an axial retention force.

8. The transition of claim 1, wherein the holding module has a shielding function.

9. The transition of claim 8, wherein the shielding function is given in that the holding module is made of an electrically conductive rubber material.

10. The transition of claim 8, wherein the shielding function is given by an electrically conductive coating on the surface of the holding module.

11. The transition of claim 8, wherein the shielding function is given by means of a shield of electrically conductive rubber material placed transversely in the axial through opening of the holding module and going to the outside of the holding module.

12. The transition of claim 1, wherein a conductive tape is provided for contact with the outside of the shield pipe inside the axial through opening of the holding module and wherein the conductive tape goes transversally around the outside of the holding module.

13. The transition of claim 1, wherein the holding module is formed of two parts, whereby the axial through opening is formed of semi-cylindrical recesses of the two parts of the holding module.

14. The transition of claim 1, wherein the holding module is a module to be placed inside a frame together with a plurality of additional modules, stay plates and a compression unit.

15. The transition of claim 1, wherein the holding module is a cylindrical seal, comprising a compressible body, first fittings and second fitting.

16. The transition of claim 1, wherein the holding module is made of electrically conductive rubber material.

17. The transition of claim 1, wherein the holding module has sections of peelable layers placed in the axial through opening of the holding module.

* * * * *